(12) United States Patent
Mani et al.

(10) Patent No.: US 8,722,547 B2
(45) Date of Patent: May 13, 2014

(54) ETCHING HIGH K DIELECTRICS WITH HIGH SELECTIVITY TO OXIDE CONTAINING LAYERS AT ELEVATED TEMPERATURES WITH BC13 BASED ETCH CHEMISTRIES

(75) Inventors: Radhika Mani, Sunnyvale, CA (US); Nicolas Gani, San Jose, CA (US); Wei Liu, San Jose, CA (US); Meihua Shen, Fremont, CA (US); Shashank C. Deshmukh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 165 days.

(21) Appl. No.: 11/736,562

(22) Filed: Apr. 17, 2007

(65) Prior Publication Data

US 2007/0249182 A1 Oct. 25, 2007

Related U.S. Application Data

(60) Provisional application No. 60/793,962, filed on Apr. 20, 2006.

(51) Int. Cl.
*H01L 21/31* (2006.01)
*H01L 21/311* (2006.01)
*H01L 29/51* (2006.01)

(52) U.S. Cl.
CPC .... *H01L 21/31116* (2013.01); *H01L 21/31122* (2013.01); *H01L 29/513* (2013.01); *H01L 29/517* (2013.01); *H01L 29/518* (2013.01)
USPC ........... 438/785; 438/709; 438/710; 438/714; 438/715; 438/722; 438/724; 216/62; 216/72; 216/75; 216/76; 257/E21.311; 257/311; 257/312

(58) Field of Classification Search
None
See application file for complete search history.

(56) References Cited

U.S. PATENT DOCUMENTS 4,372,807 A 2/1983 Vossen, Jr. et al.
(Continued)

FOREIGN PATENT DOCUMENTS

JP 2291131 11/1990
(Continued)

OTHER PUBLICATIONS

Kim et al. ("Inductively-coupled-Plasma Reactive Ion Etching of ZnO Using BCl3-based Plasmas and Effect of the Plasma Treatment on Ti/Au Ohmic Contacts to ZnO," Thin Solid Films, 447-448, pp. 90-94, 2004).*

(Continued)

*Primary Examiner* — Yasser A Abdelaziez
(74) *Attorney, Agent, or Firm* — Kilpatrick Townsend & Stockton LLP (57) ABSTRACT

Wafers having a high K dielectric layer and an oxide or nitride containing layer are etched in an inductively coupled plasma processing chamber by applying a source power to generate an inductively coupled plasma, introducing into the chamber a gas including $BCl_3$, setting the temperature of the wafer to be between 100° C. and 350° C., and etching the wafer with a selectivity of high K dielectric to oxide or nitride greater than 10:1. Wafers having an oxide layer and a nitride layer are etched in a reactive ion etch processing chamber by applying a bias power to the wafer, introducing into the chamber a gas including $BCl_3$, setting the temperature of the wafer to be between 20° C. and 200° C., and etching the wafer with an oxide to nitride selectivity greater than 10:1. Wafers having an oxide layer and a nitride layer are etched in a an inductively coupled plasma processing chamber by applying a bias power to the wafer, applying a source power to generate an inductively coupled plasma, introducing into the chamber a gas including $BCl_3$, setting the temperature of the wafer to be between 20° C. and 200° C., and etching the wafer with an oxide to nitride selectivity greater than 10:1.

11 Claims, 11 Drawing Sheets

(56) References Cited

U.S. PATENT DOCUMENTS

| | | |
|---|---|---|
| 4,375,385 A | 3/1983 | Halon |
| 4,482,419 A | 11/1984 | Tsukada et al. |
| 4,563,240 A | 1/1986 | Shibata et al. |
| 4,618,398 A | 10/1986 | Nawata et al. |
| 4,680,086 A | 7/1987 | Thomas et al. |
| 4,842,676 A | 6/1989 | Jucha et al. |
| 4,855,016 A | 8/1989 | Jucha et al. |
| 4,897,154 A | 1/1990 | Chakravarti et al. |
| 4,940,509 A | 7/1990 | Tso et al. |
| 4,986,896 A | 1/1991 | Avidan et al. |
| 5,223,453 A | 6/1993 | Sopori |
| 5,236,537 A | 8/1993 | Asaka |
| 5,252,181 A | 10/1993 | Dutartre et al. |
| 5,258,333 A | 11/1993 | Shappir et al. |
| 5,427,638 A | 6/1995 | Goetz et al. |
| 5,462,635 A | 10/1995 | Ono et al. |
| 5,466,636 A | 11/1995 | Cronin et al. |
| 5,468,679 A | 11/1995 | Paz De Araujo et al. |
| 5,470,797 A | 11/1995 | Mastrangelo |
| 5,508,207 A | 4/1996 | Horai et al. |
| 5,578,133 A | 11/1996 | Sugino et al. |
| 5,769,952 A | 6/1998 | Komino |
| 5,786,277 A | 7/1998 | Yamamoto |
| 5,895,248 A | 4/1999 | De Boer et al. |
| 5,932,048 A | 8/1999 | Furukawa et al. |
| 5,933,751 A | 8/1999 | Hirota |
| 5,968,848 A | 10/1999 | Tanabe et al. |
| 5,983,907 A | 11/1999 | Danh et al. |
| 6,010,966 A | 1/2000 | Ionov |
| 6,077,776 A | 6/2000 | Cho et al. |
| 6,090,717 A | 7/2000 | Powell et al. |
| 6,107,192 A | 8/2000 | Subrahmanyan et al. |
| 6,146,929 A | 11/2000 | Oana et al. |
| 6,180,505 B1 | 1/2001 | Uzoh |
| 6,204,087 B1 | 3/2001 | Parker et al. |
| 6,255,226 B1 | 7/2001 | Zheng et al. |
| 6,265,749 B1 | 7/2001 | Gardner et al. |
| 6,277,767 B1 | 8/2001 | Shiramizu |
| 6,303,505 B1 | 10/2001 | Ngo et al. |
| 6,329,276 B1 | 12/2001 | Ku et al. |
| 6,413,863 B1 | 7/2002 | Liu et al. |
| 6,436,838 B1 * | 8/2002 | Ying et al. .................... 438/710 |
| 6,451,647 B1 * | 9/2002 | Yang et al. .................... 438/240 |
| 6,500,357 B1 | 12/2002 | Luo et al. |
| 6,508,920 B1 | 1/2003 | Ritzdorf et al. |
| 6,511,872 B1 | 1/2003 | Donnelly et al. |
| 6,511,918 B2 | 1/2003 | Wege et al. |
| 6,566,148 B2 | 5/2003 | Hsu et al. |
| 6,566,211 B2 | 5/2003 | Graas et al. |
| 6,660,647 B1 | 12/2003 | Ono et al. |
| 6,666,986 B1 | 12/2003 | Vaartstra |
| 6,902,681 B2 | 6/2005 | Nallan et al. |
| 7,780,862 B2 | 8/2010 | Shen et al. |
| 7,964,512 B2 | 6/2011 | Wang et al. |
| 2001/0046738 A1 | 11/2001 | Au et al. |
| 2002/0005392 A1 | 1/2002 | Luo et al. |
| 2002/0119669 A1 | 8/2002 | Ono et al. |
| 2003/0045098 A1 | 3/2003 | Verhaverbeke et al. |
| 2003/0067023 A1 | 4/2003 | Olewine et al. |
| 2003/0129847 A1 | 7/2003 | Celii et al. |
| 2003/0170985 A1 | 9/2003 | Hwang et al. |
| 2003/0194877 A1 | 10/2003 | Yau et al. |
| 2004/0007561 A1 | 1/2004 | Nallan et al. |
| 2004/0011380 A1 | 1/2004 | Ji et al. |
| 2004/0074869 A1 | 4/2004 | Wang et al. |
| 2004/0262262 A1 | 12/2004 | Chiu et al. |
| 2005/0081781 A1 * | 4/2005 | Lin et al. .................... 117/104 |
| 2005/0118353 A1 | 6/2005 | Chen et al. |
| 2005/0153563 A1 | 7/2005 | Ramalingam et al. |
| 2005/0164479 A1 * | 7/2005 | Perng et al. .................... 438/591 |
| 2005/0164511 A1 | 7/2005 | Chen et al. |
| 2005/0176191 A1 | 8/2005 | Kumar et al. |
| 2005/0215062 A1 * | 9/2005 | Miyagawa et al. ........... 438/706 |
| 2005/0282341 A1 | 12/2005 | Park et al. |
| 2006/0252265 A1 | 11/2006 | Jin et al. |
| 2007/0004260 A1 | 1/2007 | Drexler et al. |
| 2007/0042601 A1 * | 2/2007 | Wang et al. .................... 438/689 |
| 2007/0190795 A1 | 8/2007 | Zhuang et al. |
| 2007/0231986 A1 | 10/2007 | Shin |
| 2007/0238302 A1 | 10/2007 | Dip et al. |
| 2007/0249182 A1 | 10/2007 | Mani et al. |

FOREIGN PATENT DOCUMENTS

| | | |
|---|---|---|
| JP | 6151383 | 5/1994 |
| JP | 2004-296477 | 10/2004 |
| JP | 2005-039015 | 2/2005 |
| JP | 2005-086080 | 3/2005 |
| JP | 2006-310676 | 11/2006 |
| JP | 2007-501533 | 1/2007 |
| JP | 2007-035860 | 2/2007 |
| KR | 20040103453 | 12/2004 |
| WO | 2004/109772 A2 | 12/2004 |

OTHER PUBLICATIONS

Min et al. ("Selective Etching of HfO2 by using inductively coupled Ar/C4F8 plasmas and the Removal of Etch Residue on Si by Using O2 Plasma Treatment," Journal of Korean Physical Society, vol. 53, No. 3, pp. 1675-1679 , 2008).*

Non-Final Office Action dated Sep. 28, 2006 for U.S. Appl. No. 11/208,573, 13 pages.

Non-Final Office Action dated Jun. 12, 2007 for U.S. Appl. No. 11/208,573, 21 pages.

Final Office Action dated Jul. 29, 2008 for U.S. Appl. No. 11/208,573, 31 pages.

Non-Final Office Action dated Apr. 1, 2009 for U.S. Appl. No. 11/208,573, 20 pages.

Final Office Action dated Feb. 2, 2010 for U.S. Appl. No. 11/208,573, 22 pages.

Non-Final Office Action dated Aug. 10, 2010 for U.S. Appl. No. 11/208,573, 15 pages.

Notice of Allowance dated Jan. 25, 2011 for U.S. Appl. No. 11/208,573, 7 pages.

Non-Final Office Action dated Jun. 5, 2008 for U.S. Appl. No. 11/386,054, 16 pages.

Final Office Action dated Mar. 30, 2009 for U.S. Appl. No. 11/386,054, 9 pages.

Non-Final Office Action dated Oct. 15, 2009 for U.S. Appl. No. 11/386,054, 11 pages.

Notice of Allowance dated Apr. 29, 2010 for U.S. Appl. No. 11/386,054, 7 pages.

* cited by examiner

FIG. 8

ETCHING HIGH K DIELECTRICS WITH HIGH SELECTIVITY TO OXIDE CONTAINING LAYERS AT ELEVATED TEMPERATURES WITH BC13 BASED ETCH CHEMISTRIES

CROSS-REFERENCES TO RELATED APPLICATIONS

This application claims the benefit of U.S. Provisional Application No. 60/793,962, filed on Apr. 20, 2006, which is incorporated herein by reference in its entirety for all purposes.

BACKGROUND

The present invention relates generally to the field of semiconductor devices and the manufacture of those semiconductor devices. More particularly, the present invention relates to methods for etching $SiO_2$ with high selectivity to $Si_3N_4$ and to etching metal oxides with high selectivity to $SiO_2$.

As computers become faster and more powerful, the semiconductor devices running those computers are becoming smaller and more complex. Many modern semiconductor devices are made of CMOS (Complimentary Metal-Oxide-Semiconductor) transistors and capacitors, in which the CMOS transistors generally include a source, drain, and gate. The gate is sometimes called a gate stack because it may include several components, such as a gate electrode and an underlying gate dielectric. Sidewall spacers (also called spacers or spacer layers) may be adjacent to the gate structure and usually include an oxide layer and a nitride layer component.

Although CMOS devices are common semiconductor devices found in many computers, they are becoming increasingly more difficult to make. One reason why it is becoming more difficult to make CMOS devices is that these devices are becoming smaller and therefore the tolerance associated with each CMOS device is becoming tighter. One method for fabricating such CMOS devices includes forming a patterned mask (e.g., photoresist mask) on a material layer disposed beneath such a mask (on an underlying layer) and then etching the material layer using the patterned photoresist mask as an etch mask. The etch mask generally is a replica of the structure to be formed (e.g., etched) in the underlying layer (or layers). As such, the etch mask has the same topographic dimensions as the structures being formed in the underlying layer(s).

Figure 1A:
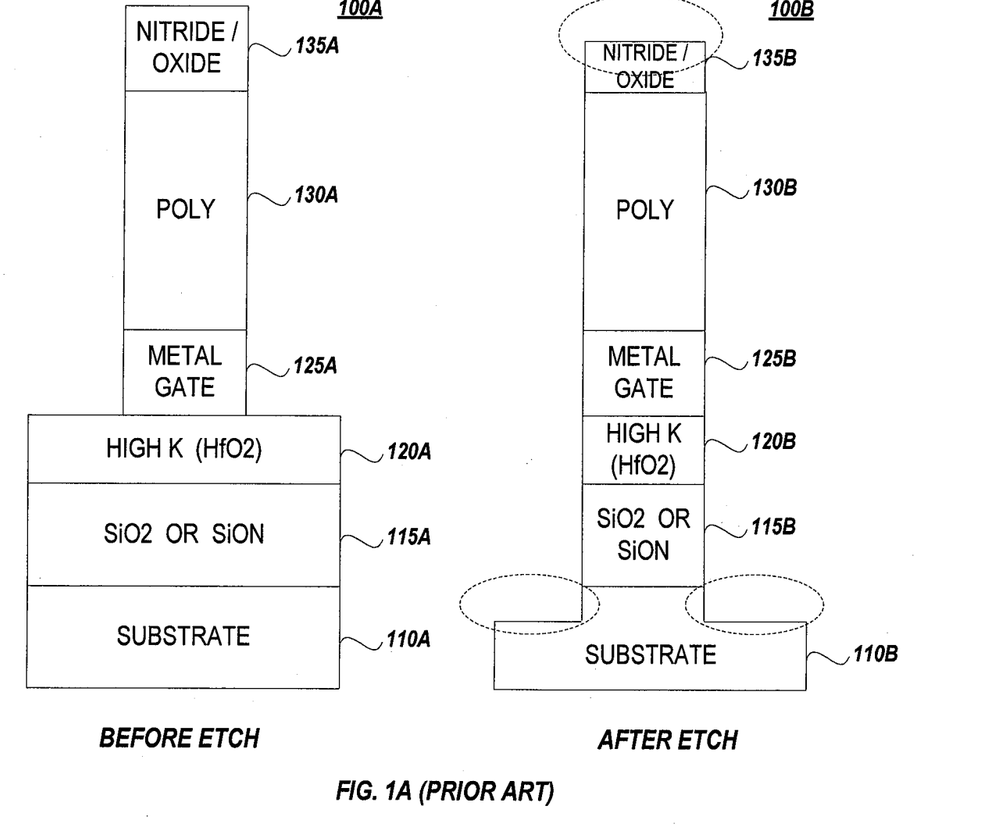
FIG. 1A show a gate electrode stack both before etching and after etching using prior art etching techniques that cause over etching into the silicon substrate.

Conventional integration schemes used to manufacture CMOS devices are susceptible to defects within a wafer resulting from process variations. Since CMOS devices require very tight tolerances, process variations and non-uniformities within a wafer can significantly reduce the performance of CMOS devices and the yields of those devices. One example of where variations occur is during the etching of high K dielectric materials in CMOS devices. Another example of where variations occur is during the etching of the spacer layers which usually includes an oxide layer positioned next to a nitride layer. Current processes used to etch high K dielectric materials can create defects and low yields because of over etching as illustrated in FIG. 1A. Current processes used to etch oxide layers in spacers can cause defects and low yields because other layers such as nitride layers are inadvertently etched, as illustrated in FIG. 1B.

FIG. 1A illustrates a partially fabricated CMOS device 100A before etching its high K dielectric layer and the same partially fabricated CMOS device 100B after etching its high K dielectric layer. CMOS device 100A includes a substrate 110A, a $SiO_2$ or SiON layer 115A, a high K dielectric layer 120A, a metal gate 125A, a polysilicon layer 130A, and a nitride oxide layer 135A. Although the etching process removes the unwanted parts of the a high K dielectric layer 120A, the etching process also removes portions of the $SiO_2$ or SiON layer 115A and the portions of the substrate 110A leaving unwanted Si recesses. The etching process also removes a portion of the nitride oxide layer 135A. CMOS device 100B includes a substrate 110B, a $SiO_2$ or SiON layer 115B, a high K dielectric layer 120B, a metal gate 125B, a polysilicon layer 130B, a nitride oxide layer 135B and dashed ellipses showing where unwanted etching has occurred. CMOS device 100B shows that the etching process has removed portions of the high K dielectric layer leaving behind the desired high K layer 120B. However, CMOS device 100B also includes dashed ellipses illustrating that the $SiO_2$ or SiON layer 115B and the portions of the substrate 110B have been over etched leaving unwanted Si recesses. Similarly, CMOS device 100B includes a dashed ellipse that encircle a portion of the nitride/oxide layer 135B that has been etched and is now clearly thinner than it was prior to etching (i.e. compare 135A with 135B).

Figure 1B:
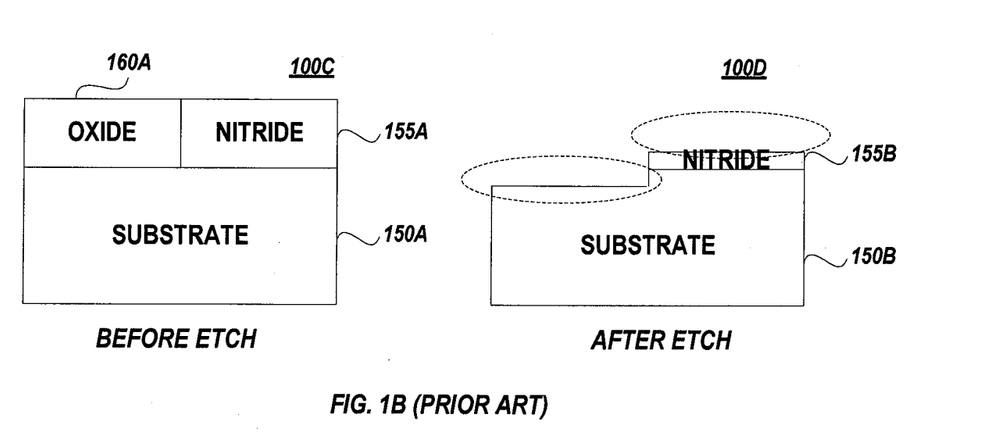
FIG. 1B show an oxide and nitride layer deposited next to each other on a substrate before etching and after etching using prior art etching techniques that cause unwanted etching.

FIG. 1B illustrates a simple structure representing a spacer layer having an oxide layer positioned next to a nitride layer before etching 100C and after etching 100D. Before etching, the structure 100C includes an oxide layer 160A positioned next to a nitride layer 155A on a substrate 150A. After etching, the structure 100D includes only the nitride layer 155B and substrate 150B, which have both been etched along with the oxide layer 160A as pointed out by the dashed ellipses. The dashed ellipses clearly show that the substrate 150B has been over etched leaving recesses and that the nitride layer 155B has also been etched so that it is much thinner than the original nitride layer 155A.

The problem with over etching has been addressed by using gasses that selectively etch silicon oxides instead of nitrides. Traditional means of etching silicon oxides while achieving selectivity between silicon oxides and nitrides is done using gasses having $CHF_3$, $CH_2F_2$, or $C_4F_8$ types of chemistries. These chemistries selectively etch oxides by passivating the nitride and preventing further etch of the nitride layers. However, etching with these chemistries results in large deposition of polymer on other parts of the wafer.

Therefore, what is needed is a method of fabricating a semiconductor device by selectively etching high K dielectric films with good vertical profiles without footing and with high selectivity to $SiO_2$ and Si. Additionally, what is needed is a method of fabricating a semiconductor device by selectively etching thin oxide cap layers on certain regions of the semiconductor device without silicon nitride loss in other regions of the device.

BRIEF SUMMARY

In one embodiment of the present invention a method for fabricating a semiconductor device includes providing a wafer into a plasma etch processing chamber, wherein the wafer comprises a high K dielectric layer and an oxide or nitride containing layer, applying a source power to generate an inductively coupled plasma, introducing into the chamber a gas including $BCl_3$, setting the temperature of the wafer to be between 100° C. and 350° C., and etching the wafer with a selectivity of high K dielectric to oxide or nitride greater than 10:1. The plasma etch processing chamber can be an inductively coupled plasma processing chamber.

In yet another embodiment of the present invention, the high K dielectric layer in the wafer provided to the plasma etch processing chamber includes $HfO_2$.

In yet another embodiment of the present invention, the high K dielectric layer in the wafer provided to the plasma etch processing chamber includes $Al_2O_3$.

In yet another embodiment of the present invention, the high K dielectric layer in the wafer provided to the plasma etch processing chamber is located over the oxide or nitride containing layer. With this configuration, the etching step is stopped before a substantial amount of the oxide or nitride containing layer is etched.

In yet another embodiment of the present invention, the source power applied to the plasma in the plasma etch processing chamber while the wafer with the high K dielectric layer is being processed ranges between 200 watts and 1000 watts.

In yet another embodiment of the present invention, the source power applied to the plasma in the plasma etch processing chamber while the wafer with the high K dielectric layer is being processed is approximately 400 watts.

In yet another embodiment of the present invention, the temperature of the wafer having the high K dielectric layer is set to be between 175° C. and 225° C.

In yet another embodiment of the present invention, the temperature of the wafer having the high K dielectric layer is set to be approximately 220° C.

In yet another embodiment of the present invention, the $BCl_3$ supplied to the plasma etch processing chamber with the wafer having a high K dielectric layer is mixed with argon. The $BCl_3$ and the argon can be mixed to have a ratio of $He/BCl_3$ ranging between 1:5 and 5:1.

In yet another embodiment of the present invention, the $BCl_3$ supplied to the plasma processing chamber with the wafer having a high K dielectric layer is mixed with helium. The $BCl_3$ and the argon can be mixed to have a ratio of $He/BCl_3$ ranging between 1:5 and 5:1.

In another embodiment of the present invention a method for fabricating a semiconductor device includes transporting a wafer having an oxide layer and a nitride layer into a reactive ion etch processing chamber, applying a bias power to the wafer, introducing into the chamber a gas including $BCl_3$, setting the temperature of the wafer to be between 20° C. and 200° C., and etching the wafer with an oxide to nitride selectivity greater than 10:1.

In another embodiment of the present invention, the oxide layer and the nitride layer of the wafer transported into the reactive ion etch processing chamber are positioned side-by-side.

In yet another embodiment of the present invention, the oxide layer of the wafer transported into the reactive ion etch processing chamber is located over the nitride layer. With this configuration, the etching step is stopped before a substantial amount of the nitride layer is etched.

In yet another embodiment of the present invention, the bias power applied to the wafer in the reactive ion etch processing chamber ranges between 100 watts and 1500 watts.

In yet another embodiment of the present invention, the $BCl_3$ is introduced into the reactive ion etch processing chamber using a flow rate ranging from 50 sccm through 500 sccm.

In yet another embodiment of the present invention, the reactive ion etch processing chamber is maintained at a process pressure ranging from 20 mTorr and 200 mTorr during the etch process.

In yet another embodiment of the present invention, the $BCl_3$ supplied to the reactive ion etch processing chamber is mixed with argon. The $BCl_3$ and the argon can be mixed to have a ratio of $Ar/BCl_3$ ranging between 1:5 and 5:1.

In yet another embodiment of the present invention, the $BCl_3$ supplied to the reactive ion etch processing chamber is mixed with helium. The $BCl_3$ and the helium can be mixed to have a ratio of $He/BCl_3$ ranging between 1:5 and 5:1.

In yet another embodiment of the present invention, the $BCl_3$ supplied to the reactive ion etch processing chamber is mixed with an inert gas. The inert gas can be selected from the group consisting of Ar, N2, He, and Xe.

In yet another embodiment of the present invention, the $BCl_3$ supplied to the reactive ion etch processing chamber is mixed with a passivant. The passivant can be selected from the group consisting of $N_2$, $O_2$, and $CH_4$.

In another embodiment of the present invention a method for fabricating a semiconductor device includes transporting a wafer having an oxide layer and a nitride layer into a plasma etch processing chamber, applying a bias power to the wafer, applying a source power to generate an inductively coupled plasma, introducing into the chamber a gas including $BCl_3$, setting the temperature of the wafer to be between 20° C. and 200° C., and etching the wafer with an oxide to nitride selectivity greater than 10:1. The plasma etch processing chamber can be an inductively coupled plasma processing chamber.

In yet another embodiment of the present invention, the oxide layer and the nitride layer of the wafer transported into the plasma etch processing chamber are positioned side-by-side.

In yet another embodiment of the present invention, the oxide layer of the wafer transported into the plasma etch processing chamber is located over the nitride layer. With this configuration, the etching step is stopped before a substantial amount of the nitride layer is etched.

In yet another embodiment of the present invention, the bias power applied to the wafer in the plasma etch processing chamber ranges between zero watts and 100 watts.

In yet another embodiment of the present invention, the source power applied to the plasma in the plasma etch processing chamber ranges between 200 watts and 1500 watts.

In yet another embodiment of the present invention, the $BCl_3$ supplied to the plasma etch processing chamber is mixed with argon. The $BCl_3$ and the argon can be mixed to have a ratio of $Ar/BCl_3$ ranging between 1:5 and 5:1.

In yet another embodiment of the present invention, the $BCl_3$ supplied to the plasma etch processing chamber is mixed with helium. The $BCl_3$ and the helium can be mixed to have a ratio of $He/BCl_3$ ranging between 1:5 and 5:1.

In yet another embodiment of the present invention, the $BCl_3$ supplied to the plasma etch processing chamber is mixed with an inert gas. The inert gas can be selected from the group consisting of Ar, N2, He, and Xe.

In yet another embodiment of the present invention, the $BCl_3$ supplied to the plasma etch processing chamber is mixed with a passivant. The passivant can be selected from the group consisting of $N_2$, $O_2$, and $CH_4$.

DETAILED DESCRIPTION

Embodiments of the present invention include methods of fabricating a semiconductor device by selectively etching thin oxide cap layers on certain regions of the device without silicon nitride loss in other regions of the device. These methods are used to etch $SiO_2$ and/or metal oxides such as $HfO_2$ and $Al_2O_3$ with high selectivity to silicon nitride. Some embodiments include providing a wafer into a plasma etch processing chamber (e.g. an inductively coupled plasma processing chamber), wherein the wafer comprises a high K dielectric layer and an oxide or nitride containing layer, applying a source power to generate an inductively coupled plasma, introducing into the chamber a gas including $BCl_3$, setting the temperature of the wafer to be between 100° C. and 350° C., and etching the wafer with a selectivity of high K dielectric to oxide or nitride greater than 10:1. Additional embodiments include transporting a wafer having an oxide layer and a nitride layer into a reactive ion etch processing chamber, applying a bias power to the wafer, introducing into the chamber a gas including $BCl_3$, setting the temperature of the wafer to be between 100° C. and 350° C., and etching the wafer with an oxide to nitride selectivity greater than 10:1. Other embodiments include transporting a wafer having an oxide layer and a nitride layer into a plasma etch processing chamber (e.g. an inductively coupled plasma processing chamber), applying a bias power to the wafer, applying a source power to generate an inductively coupled plasma, introducing into the chamber a gas including $BCl_3$, setting the temperature of the wafer to be between 20° C. and 200° C., and etching the wafer with an oxide to nitride selectivity greater than 10:1.

Figure 2A:
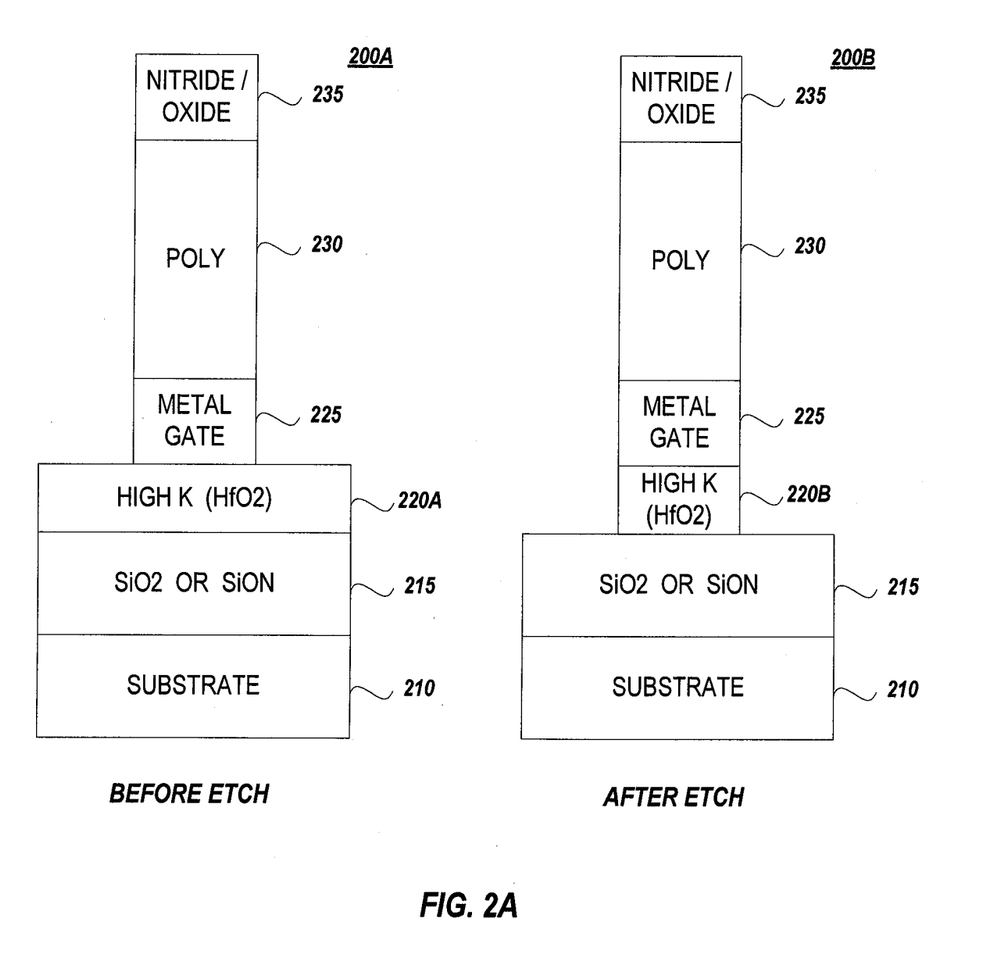
FIG. 2A show a gate electrode stack both before etching and after etching using etching techniques, in accordance with one embodiment of the invention.

FIG. 2A illustrates a partially fabricated CMOS device 200A before etching and a partially fabricated CMOS device 200B after etching with $BCl_3$, in accordance with one embodiment of the invention. CMOS device 200A includes a substrate 210, a $SiO_2$ or SiON layer 215, a gate dielectric layer 220, a metal gate 225, a polysilicon layer 230, and a hardmask layer 235. CMOS device 200B includes substrate 210, $SiO_2$ or SiON layer 215, an etched gate dielectric layer 220B, metal gate 225, polysilicon layer 230, and hardmask layer 235.

After CMOS device 200A has been etched using $BCl_3$, the gate dielectric layer 220 has been removed everywhere except directly under the metal gate 225. Moreover, since the process used in accordance with the invention is highly selective to silicon nitride, almost none of the hardmask 235 and SiON layer 215 are removed. In the prior art the etching process removes portions of the silicon located in the substrate 110 and the SiO2 and SiON 115 layers creating silicon recesses. A comparison of FIG. 1A with FIG. 2A shows the advantages of etching with $BCl_3$, because etching with $BCl_3$ does not create the silicon recesses shown in FIG. 1A. Further details of the etching process are described with reference to FIGS. 3-5 below.

In one embodiment of the present invention the substrate 210 can be a silicon substrate. If the CMOS device is a PMOS then the substrate can be an n-type substrate whereas if the CMOS device is an NMOS then the substrate can be a p-type substrate. In one embodiment of the present invention, NMOS transistors are formed in p-type substrates by diffusing n-type material into the substrate. PMOS transistors can be formed by diffusing a well of n-type material into the substrate so that p-type diffusion then defines the drain and source of the PMOS transistors. In this embodiment, both the NMOS and PMOS devices can be constructed on a p-type substrate. The $SiO_2$ or SiON layer 215 can be deposited directly onto the substrate 200. The $SiO_2$ or SiON layer 215 can include either a layer having both nitride layers and oxide layers located side by side or can include oxide layers disposed over nitride layers.

The gate dielectric layer 220 can be either a low K dielectric material or a high K material. CMOS devices with low K gate dielectric 220 use low K dielectric materials such as silicon oxide, silicon nitride, or silicon oxynitride. CMOS devices with high K gate dielectric 220 use high K dielectric materials such as hafnium-oxide ($HfO_2$), or aluminum-oxide ($Al_2O_3$). The gate dielectric layer 220 can be deposited using deposition processes such as physical vapor deposition, sputtering, ion-beam deposition, and chemical vapor deposition. The thickness of the gate dielectric layer 220 can range from between about 5 angstroms and about 100 angstroms.

The metal gate layer 225 and the polysilicon layer 230 form the gate electrode. The polysilicon layer 230 is formed on the metal gate layer 225 by depositing polysilicon onto the metal gate layer 225 and patterning the polysilicon with photolithographic techniques. The thickness of the polysilicon layer 230 can range from about 500 angstroms to about 3500 angstroms.

The hardmask layer 235 can be deposited directly on top of the polysilicon layer 230 or can be deposited on top of other materials that are deposited on top of the polysilicon layer 230 (e.g., in other embodiments there can be intermediate layers between the polysilicon layer 230 and the hardmask layer 235). The hardmask 235 material may be any material used in hardmask application, including silicon oxide or silicon nitride. The hardmask material may be deposited using deposition processes such as plasma enhanced chemical vapor deposition (PECVD) and low pressure chemical vapor deposition (LPCVD).

Figure 2B:
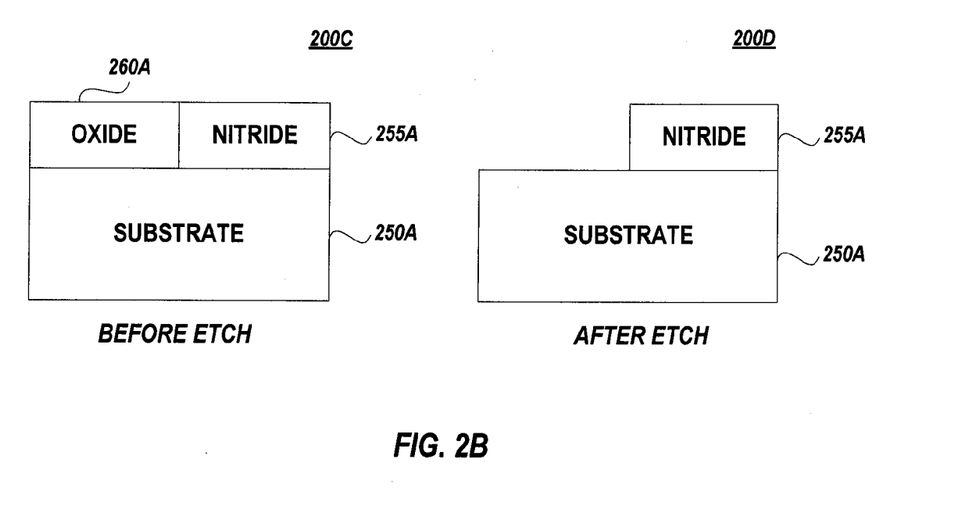
FIG. 2B show an oxide and nitride layer deposited next to each other on a substrate before etching and after etching using etching techniques, in accordance with one embodiment of the invention.

FIG. 2B shows an oxide and nitride layer deposited next to each other on a substrate before etching 200C and after etching 200D using $BCl_3$, in accordance with one embodiment of the invention. The structure before etching 200C includes a substrate 250A, a nitride layer 255A and an oxide layer 260A. The nitride layer 255A and the oxide layer 260A are positioned next to each other so that the effects on the nitride layer 255A can be seen when the oxide layer 260A is etched with the etching with $BCl_3$. The structure after etching 200D is positioned next to the before etch structure 200C to illustrate that etching with $BCl_3$ removes substantially none of the substrate 250A and none of the nitride layer 255A. Comparison FIG. 1B with FIG. 2B shows the advantages of etching with $BCl_3$, because etching the oxide layer with $BCl_3$ does not remove the adjacent nitride layer. Further details of the etching process are described with reference to FIGS. 3-5 below.

Figure 2C:
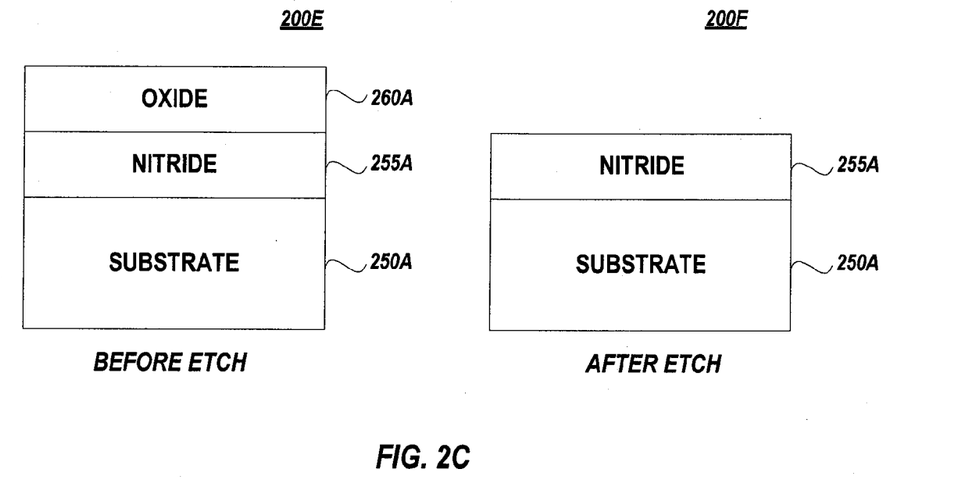
FIG. 2C show an oxide deposited over a nitride layer on a substrate before etching and after etching using etching techniques, in accordance with one embodiment of the invention.

FIG. 2C show an oxide deposited over a nitride layer on a substrate before etching 200E and after etching 200F using $BCl_3$, in accordance with one embodiment of the invention. The structure before etching 200E includes a substrate 250A, a nitride layer 255A and an oxide layer 260A. The oxide layer 260A is positioned directly over the nitride layer 255A and the nitride layer 255A is positioned directly over the substrate 250A. After etching the oxide layer 260A using the $BCl_3$ chemistry only the nitride layer 255A and the substrate 260A remain as illustrated in the after etch structure 200F. Since the $BCl_3$ chemistry does not substantially etch the nitride layer 255A, the nitride layer 255A can serve as a stopping layer to stop the etching process.

Figure 3:
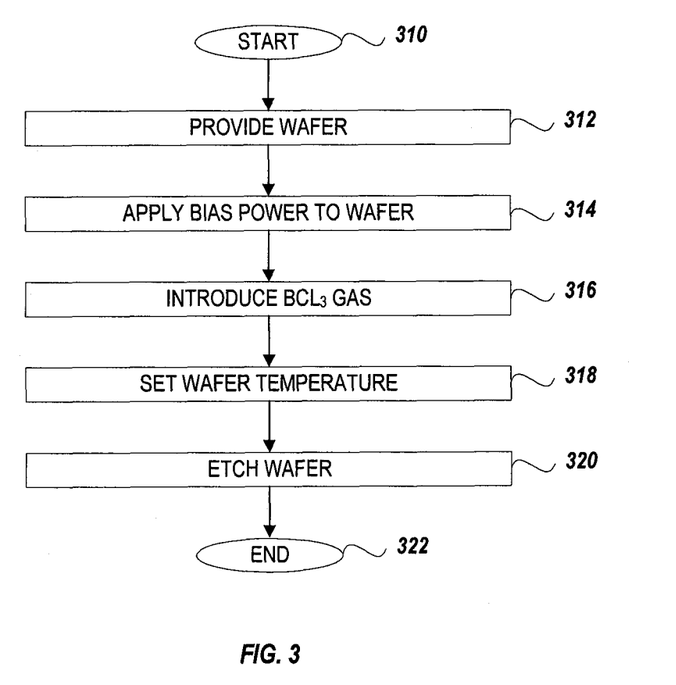
FIG. 3 is a flow chart showing the steps used to etch oxide layers with high selectivity to nitride using a plasma etch processing chamber, in accordance with one embodiment of the invention.

FIG. 3 is a flow chart showing an exemplary process of etching oxide layers with high selectivity to nitride using a plasma etch processing chamber (such as an RIE apparatus for example), in accordance with one embodiment of the invention. In one embodiment, the process illustrated in the flow chart of FIG. 3 is used during the manufacture of the CMOS device 200A. The process starts at 310 when the etch system is prepared for receiving a partially fabricated CMOS device 200. At 312, a partially fabricated CMOS device is introduced into a process chamber by transporting the wafer onto a pedestal such as an electrostatic chuck. The partially fabricated CMOS wafer has already undergone several processes including the deposition of the polysilicon layer 230 and the deposition of the hardmask layer 235. Additionally, the partially fabricated CMOS wafer has been prepared to include a $SiO_2$ and SiON 215 layer which includes either a layer having both nitride layers and oxide layers located side by side or oxide layers disposed over nitride layers. After the wafer has been placed on the pedestal, a bias power is applied to the wafer at 314. The bias power ranges between 100 watts and 1500 watts. In this embodiment, no source power is applied.

Next, at 316, boron-trichloride ($BCl_3$) gas is introduced into the process chamber. The $BCl_3$ gas is introduced so that the process pressure in the plasma etch processing chamber is maintained between about 20 milliTorr (mTorr) and 200 mTorr. In one embodiment, this pressure is obtained by limiting the process gas flow rate to be between 50 sccm and 500 sccm and adjusting the pumping by appropriately throttling a valve going to the vacuum pump. The $BCl_3$ is distributed uniformly over the wafer through the use of injection nozzles. In one embodiment, the $BCl_3$ gas is introduced at room temperature. The temperature of the $BCl_3$ gas can be is controlled with the use of heater. In another embodiment, the $BCl_3$ gas can be diluted with inert gasses such as Ar, $N_2$, He, and Xe or with passivants such as $N_2$, $O_2$, and $CH_4$. For example, the $BCl_3$ gas can be diluted with 0 sccm through 500 sccm so that ratio of Ar/$BCl_3$ ranges between 1:5 and 5:1.

Next at 318, the wafer temperature is set to between 20° C. and 200° C. The wafer temperature can be set with the use of a heater located within the pedestal or electrostatic chuck. In the one embodiment, the wafer temperature is maintained between 20° C. and 70° C. with the use of a resistive heater located in the electrostatic chuck. In some applications it may be desirable to interchange the order of 314-318. For example in situations where some time is required to reach a stable uniform temperature across the wafer at 318 may be done before 314 and there may be a waiting time to allow the wafer temperature to stabilize before the bias power is applied or the $BCl_3$ gas is introduced into the chamber.

Once all three process conditions listed in 314-318 have been set, the wafer is etched at 320 until the dielectric layer has been removed according to a predetermined pattern. This process can be controlled by either measuring the etch time or by using an end-point detector. Once the etching process is complete, the etched wafer is removed from the etch chamber at 322 and sent on to the next process.

In one embodiment, the process described above with reference to FIG. 3 is used to etch dielectric films and has a high selectivity to only etching the dielectric materials without effecting the $SiO_2$ and SiON materials. The etching process has a selectivity that is sufficiently high that the ratio of dielectric etching to $SiO_2$ and SiON etching is greater than 10:1.

Figure 4:
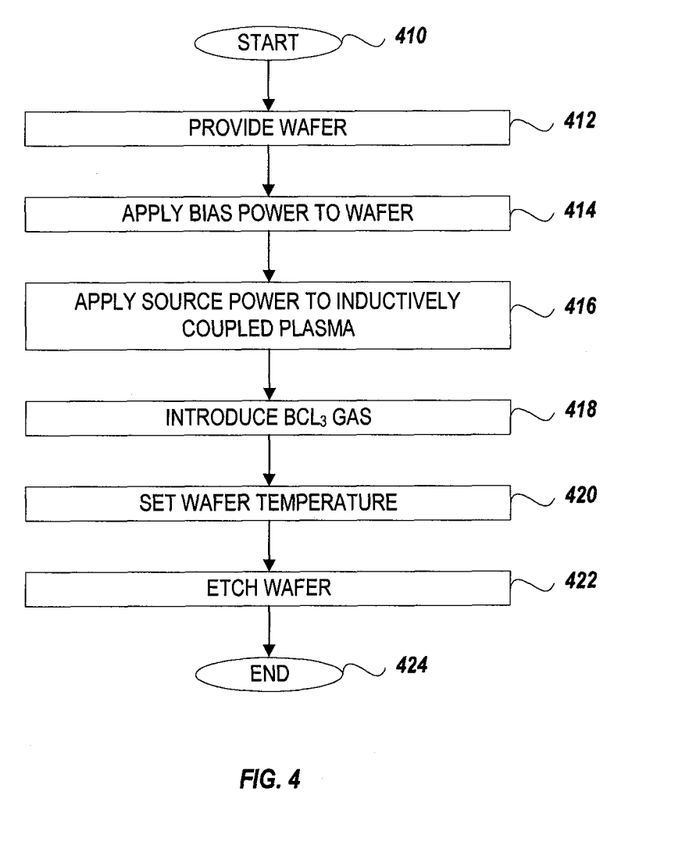
FIG. 4 is a flow chart showing the steps used to etch oxide layers with high selectivity to nitride using a plasma etch processing chamber, in accordance with one embodiment of the invention.

FIG. 4 is a flow chart showing an exemplary process used to etch oxide layers with high selectivity to nitride using a plasma etch processing chamber (e.g. an inductively coupled plasma processing chamber), in accordance with one embodiment of the invention. The process illustrated in the flow chart of FIG. 4 can be used during the manufacture of the CMOS device 200A. The process starts at 410 when the etch system is prepared for receiving a partially fabricated CMOS device 200A. At 412, a partially fabricated CMOS device is introduced into a process chamber by transporting the wafer onto a pedestal such as an electrostatic chuck. The partially fabricated CMOS wafer has already undergone several processes including the deposition of the polysilicon layer 230 and the deposition of the hardmask layer 235. Additionally, the partially fabricated CMOS wafer has been prepared to include a $SiO_2$ and SiON 215 layer which includes either a layer having both nitride layers and oxide layers located side by side or oxide layers disposed over nitride layers. After the wafer has been placed on the pedestal, a bias power is applied to the wafer at 414. The bias power ranges between zero watts and 100 watts. At 416, a source power is applied to the inductively coupled plasma. The source power ranges between 200 watts and 1500 watts.

Next at 418, boron-trichloride ($BCl_3$) gas is introduced into the process chamber. The $BCl_3$ gas is introduced so that the process pressure in the plasma etch processing chamber is maintained between about 20 milliTorr (mTorr) and 200 mTorr. In one embodiment, this pressure is obtained by limiting the process gas flow rate to be between 50 sccm and 500 sccm and adjusting the pumping by appropriately throttling a valve going to the vacuum pump. The $BCl_3$ is distributed uniformly over the wafer through the use of injection nozzles. In one embodiment, the $BCl_3$ gas is introduced at room temperature. The temperature of the $BCl_3$ gas can be is controlled with the use of heater. In another embodiment, the $BCl_3$ gas can be diluted with inert gasses such as Ar, $N_2$, He, and Xe or with passivants such as $N_2$, $O_2$, and $CH_4$. For example, the $BCl_3$ gas can be diluted with 0 sccm through 500 sccm so that ratio of $Ar/BCl_3$ ranges between 1:5 and 5:1.

Next at 420 the wafer temperature is set to between 20° C. and 200° C. The wafer temperature can be set with the use of a heater located within the pedestal or electrostatic chuck. In the one embodiment the wafer temperature is maintained between 20° C. and 70° C. with the use of a resistive heater located in the electrostatic chuck. In some applications it may be desirable to interchange the order of 414-420. For example in situations where some time is required to reach a stable uniform temperature across the wafer, the process at 420 may be done before 414 and there may be a waiting time to allow the wafer temperature to stabilize before the bias power is applied or the $BCl_3$ gas is introduced into the chamber. In other embodiments it may be desirable to start 418 before 416. Still in other embodiments it may be desirable to start all the steps 414-420 at the same time.

Once all three process conditions in steps 414-420 have been set, the wafer is etched in step 422 until the dielectric layer has been removed according to a predetermined pattern. This process can be controlled by either measuring the etch time or by using an end-point detector. Once the etching process is complete, the etched wafer is removed from the etch chamber in step 424 and sent on to the next process.

Figure 5:
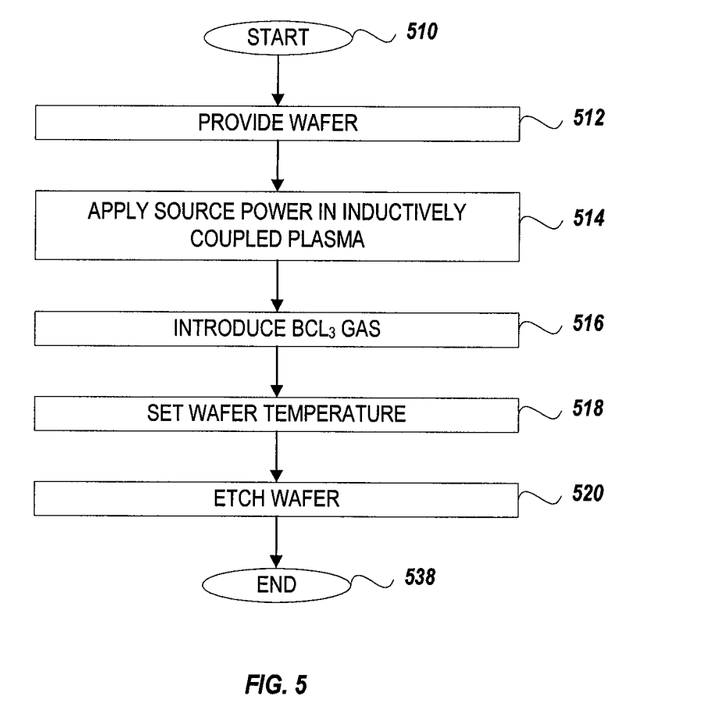
FIG. 5 is a flow chart showing the steps used to etch high K materials with high selectivity to nitride or silicon using a plasma etch processing apparatus, in accordance with one embodiment of the invention.

FIG. 5 is a flow chart showing an exemplary process used to etch high K materials with high selectivity to nitride or silicon using a plasma etch processing chamber (e.g. an inductively coupled plasma processing chamber), in accordance with one embodiment of the invention. The process illustrated in the flow chart of FIG. 5 is used during the manufacture of the CMOS device 200A having high K dielectric material used in the dielectric gate. The process starts at 510 when the etch system is prepared for receiving a partially fabricated CMOS device 200. At 512, a partially fabricated CMOS device having high K dielectric material deposited over the $SiO_2$ or SiON is introduced into a process chamber by transporting the wafer onto a pedestal such as an electrostatic chuck. The partially fabricated CMOS wafer has already undergone several processes including the deposition of the high K gate dielectric layer 220, the deposition of the metal gate layer 225, the deposition of the polysilicon layer 230 and the deposition of the hardmask layer 235. Additionally, the partially fabricated CMOS wafer has been prepared to include a $SiO_2$ and SiON 215 layer which includes either a layer having both nitride layers and oxide layers located side by side or oxide layers disposed over nitride layers. After the wafer has been placed on the pedestal, a source power is applied to the inductively coupled plasma at 514. The source power ranges between 200 watts and 1000 watts. In one embodiment the source power ranged from 200 watts to 600 watts with the optimum source power for one application being approximately 400 watts. In this embodiment, no bias power is applied.

Next at 516, boron-trichloride ($BCl_3$) gas is introduced into the process chamber. The $BCl_3$ gas is introduced so that the process pressure in the plasma etch processing chamber is maintained between about 4 milliTorr (mTorr) and 50 mTorr. In one embodiment, this pressure is obtained by limiting the process gas flow rate to be between 50 sccm and 500 sccm and adjusting the pumping by appropriately throttling a valve going to the vacuum pump. The $BCl_3$ is distributed uniformly over the wafer through the use of injection nozzles. In one embodiment, the $BCl_3$ gas is introduced at room temperature. The temperature of the $BCl_3$ gas can be is controlled with the use of heater. In another embodiment, the $BCl_3$ gas can be diluted with inert gasses such as Ar, $N_2$, He, and Xe or with passivants such as $N_2$, $O_2$, and $CH_4$. For example, the $BCl_3$ gas can be diluted with 0 sccm through 500 sccm so that ratio of $Ar/BCl_3$ ranges between 1:5 and 5:1.

Next at 518 the wafer temperature is set to between 100° C. and 350° C. The wafer temperature can be set with the use of a heater located within the pedestal or electrostatic chuck. In one embodiment the wafer temperature is maintained between 175° C. and 225° C. with the optimal temperature for one application being approximately 220° C. The wafer can be heated using various heating techniques including a resistive heater located in the electrostatic chuck. In some applications it may be desirable to interchange the order of steps 514-518. For example in situations where some time is required to reach a stable uniform temperature across the wafer, step 518 may be done before step 514 and there may be a waiting time to allow the wafer temperature to stabilize before the source power is applied or the $BCl_3$ gas is introduced into the chamber. In other applications it may be desirable to start step 518 before step 516. Still in other applications it may be desirable to start all the steps 514-518 at the same time.

Once all three process conditions at 514-518 have been set, the wafer is etched in step 520 until the high K dielectric layer has been removed according to a predetermined pattern as discussed above with reference to FIG. 2A. This process can be controlled by either measuring the etch time or by using an end-point detector. Once the etching process is complete, the etched wafer is removed from the etch chamber in step 522 and sent on to the next process.

The process described above with reference to FIG. 5 is used to etch high K dielectric films such as $HfO_2$ and $Al_2O_3$ that are used in next generation gates. This process has a high selectivity to only etching the High K materials without affecting the $SiO_2$ and SiON materials. The etching process has a selectivity that is sufficiently high that the ratio of high K dielectric etching to $SiO_2$ and SiON etching is greater than 10:1. The process described with reference to FIG. 5 provides a process that improves the vertical high K profiles, provides zero source drain silicon recesses, provides residue free etching, and provides a process with selectivity to nitride or oxide masks. The residue free etching occurs when the wafer is etched at high temperatures between 100° C. and 350° C. using $BCl_3$ gas.

Figure 6A:
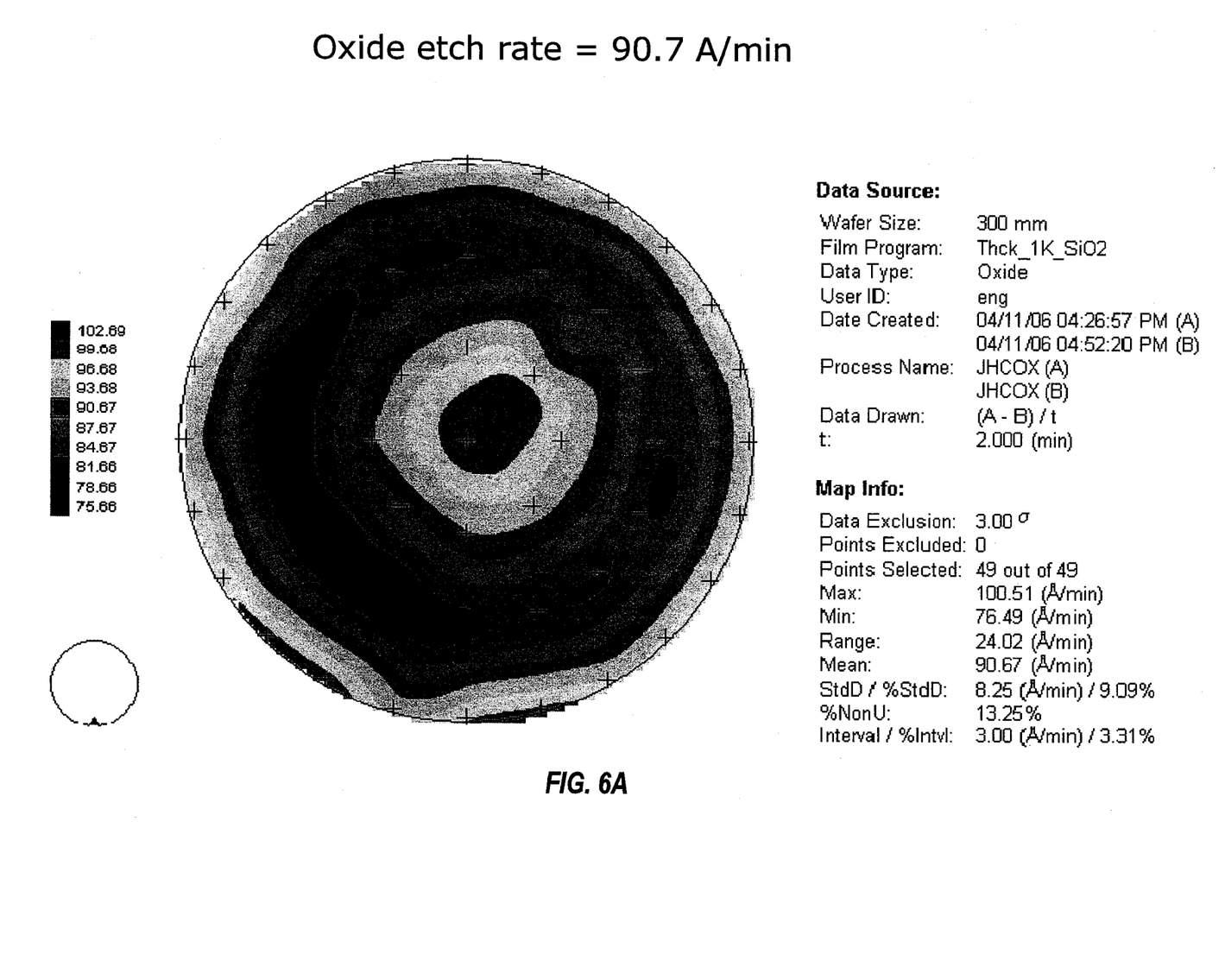
FIG. 6A is a wafer map showing the oxide etch rate data across a wafer for etching done using $BCl_3$ chemistries in a plasma etch processing chamber, in accordance with one embodiment of the invention.
Figure 6B:
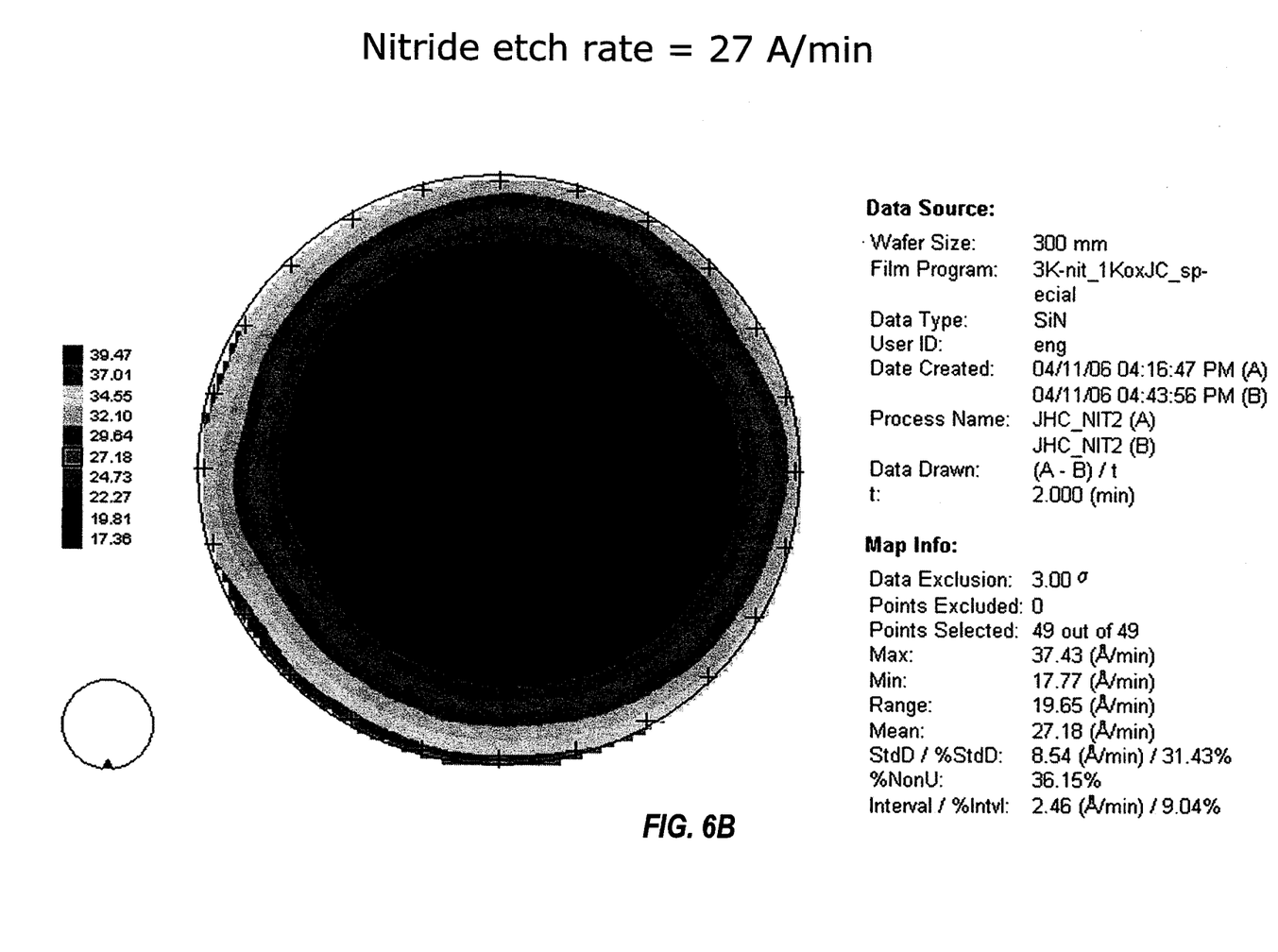
FIG. 6B is a wafer map showing the nitride etch rate data across a wafer for etching done using $BCl_3$ chemistries in an RIE apparatus, in accordance with one embodiment of the invention.

FIG. 6A is a 2D wafer map showing the oxide etch rate data across a wafer for etching done using $BCl_3$ chemistries in an RIE apparatus for two minutes, in accordance with one embodiment of the invention. The maximum oxide etch rate across the wafer is 100 Angstroms/min whereas the minimum oxide etch rate across the wafer is 77 Angstroms/min. The mean oxide etch rate across the wafer is 91 Angstroms/min with a percentage standard deviation of 9%. FIG. 6B is a 2D wafer map showing the corresponding nitride etch rate data across a wafer for etching done using $BCl_3$ chemistries in an RIE apparatus for two minutes. The maximum nitride etch rate across the wafer is 37 Angstroms/min whereas the minimum nitride etch rate across the wafer is 18 Angstroms/min. The mean nitride etch rate across the wafer is 27 Angstroms/min with a percentage standard deviation of 31%. A comparison of FIG. 6A to FIG. 6B shows that the oxide/nitride etch rate selectivity is approximately 3.4.

Figure 7A:
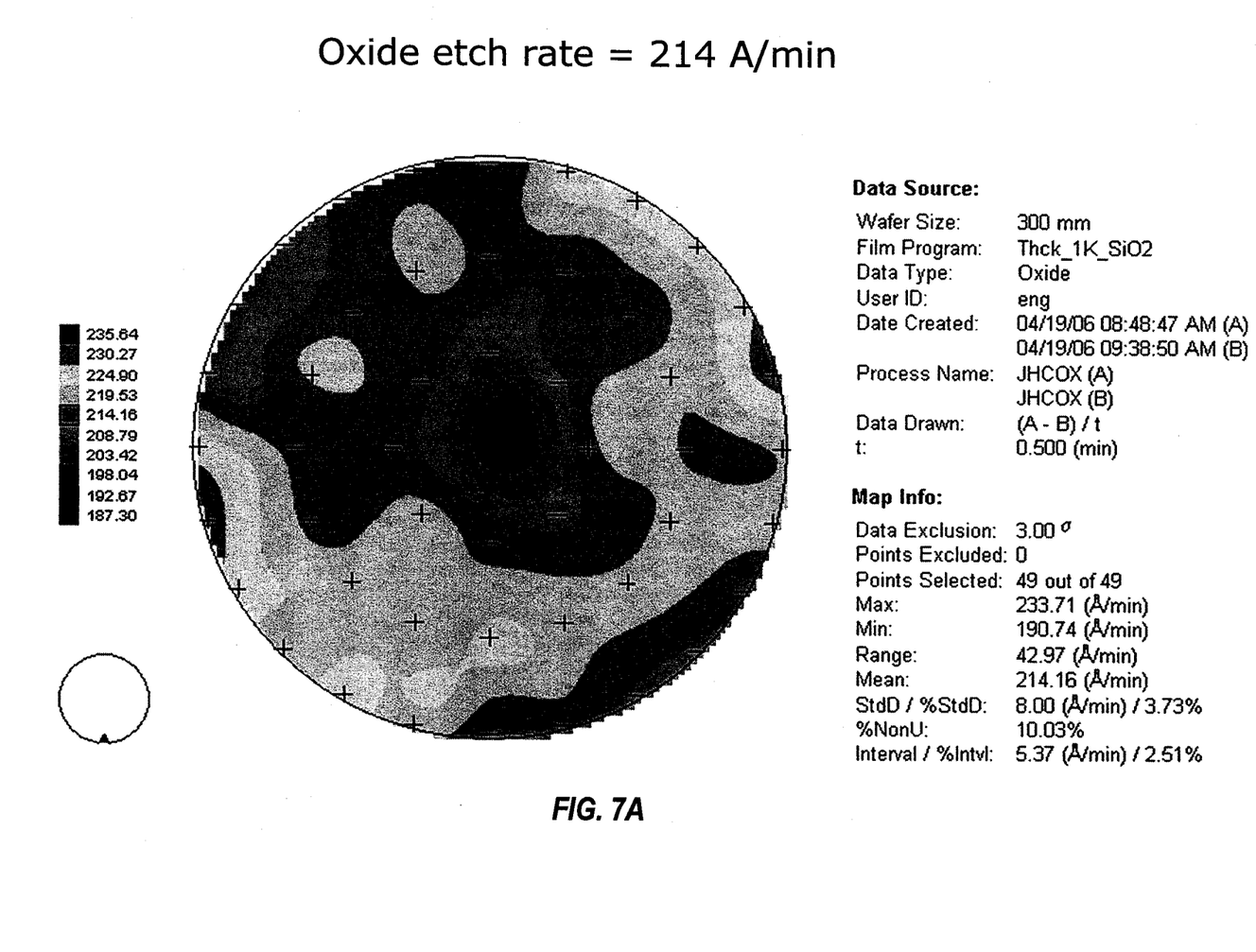
FIG. 7A is a wafer map showing the oxide etch rate data across a wafer for etching done using $BCl_3$ chemistries in an inductively coupled plasma apparatus, in accordance with one embodiment of the invention.

FIG. 7A is a 2D wafer map showing the oxide etch rate data across a wafer for etching done using $BCl_3$ chemistries in an inductively coupled plasma apparatus, in accordance with one embodiment of the invention. The maximum oxide etch rate across the wafer is 234 Angstroms/min whereas the minimum oxide etch rate across the wafer is 191 Angstroms/min.

Figure 7B:
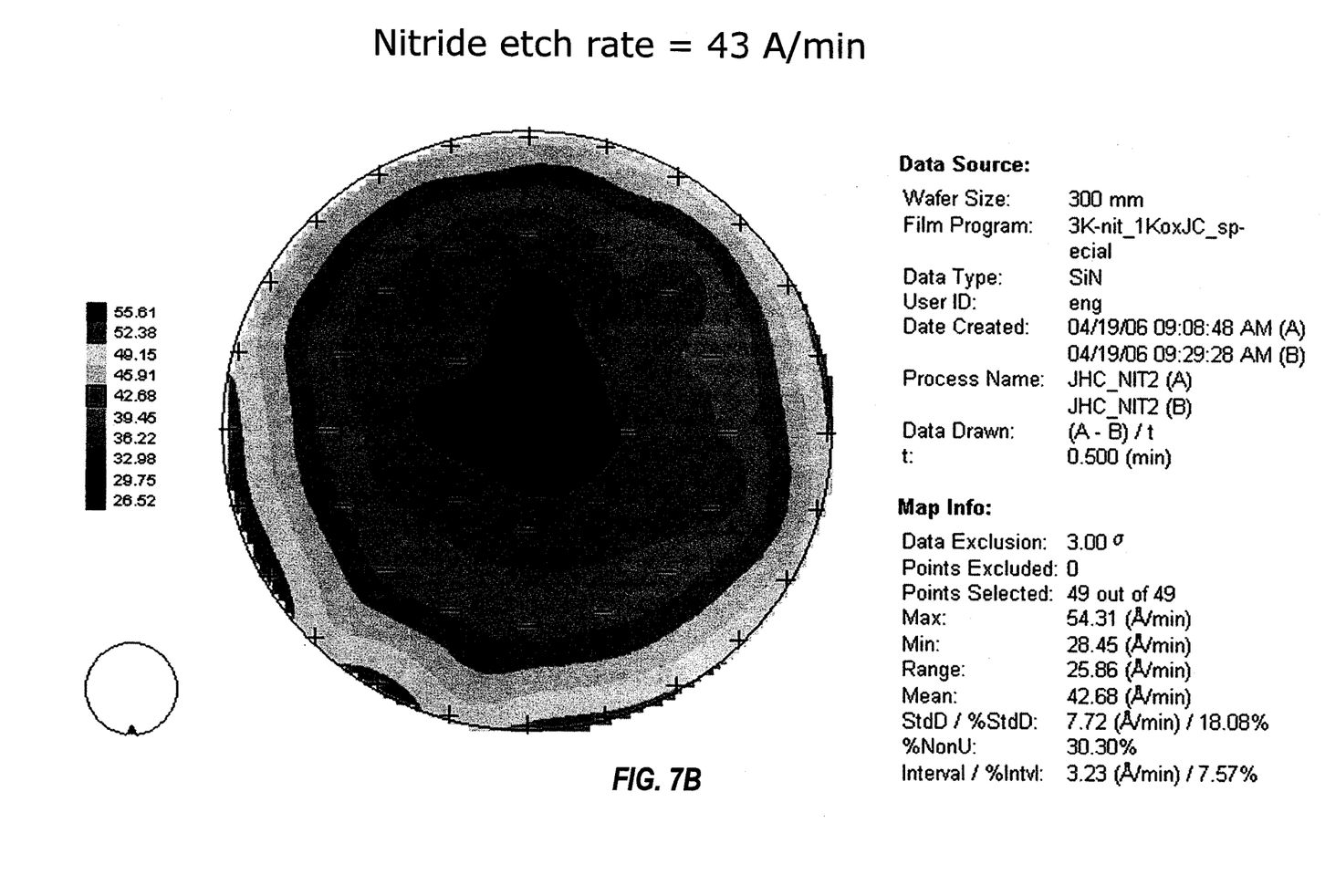
FIG. 7B is a wafer map showing the nitride etch rate data across a wafer for etching done using $BCl_3$ chemistries in an inductively coupled plasma apparatus, in accordance with one embodiment of the invention.

The mean oxide etch rate across the wafer is 214 Angstroms/min with a percentage standard deviation of 3.7%. FIG. 7B is a 2D wafer map showing the corresponding nitride etch rate data across a wafer for etching done using BCl₃ chemistries in an inductively coupled plasma apparatus. The maximum nitride etch rate across the wafer is 54 Angstroms/min whereas the minimum nitride etch rate across the wafer is 28 Angstroms/min. The mean nitride etch rate across the wafer is 43 Angstroms/min with a percentage standard deviation of 18%. A comparison of FIG. 7A to FIG. 7B shows that the oxide/nitride etch rate selectivity is approximately 5.0.

Figure 8:
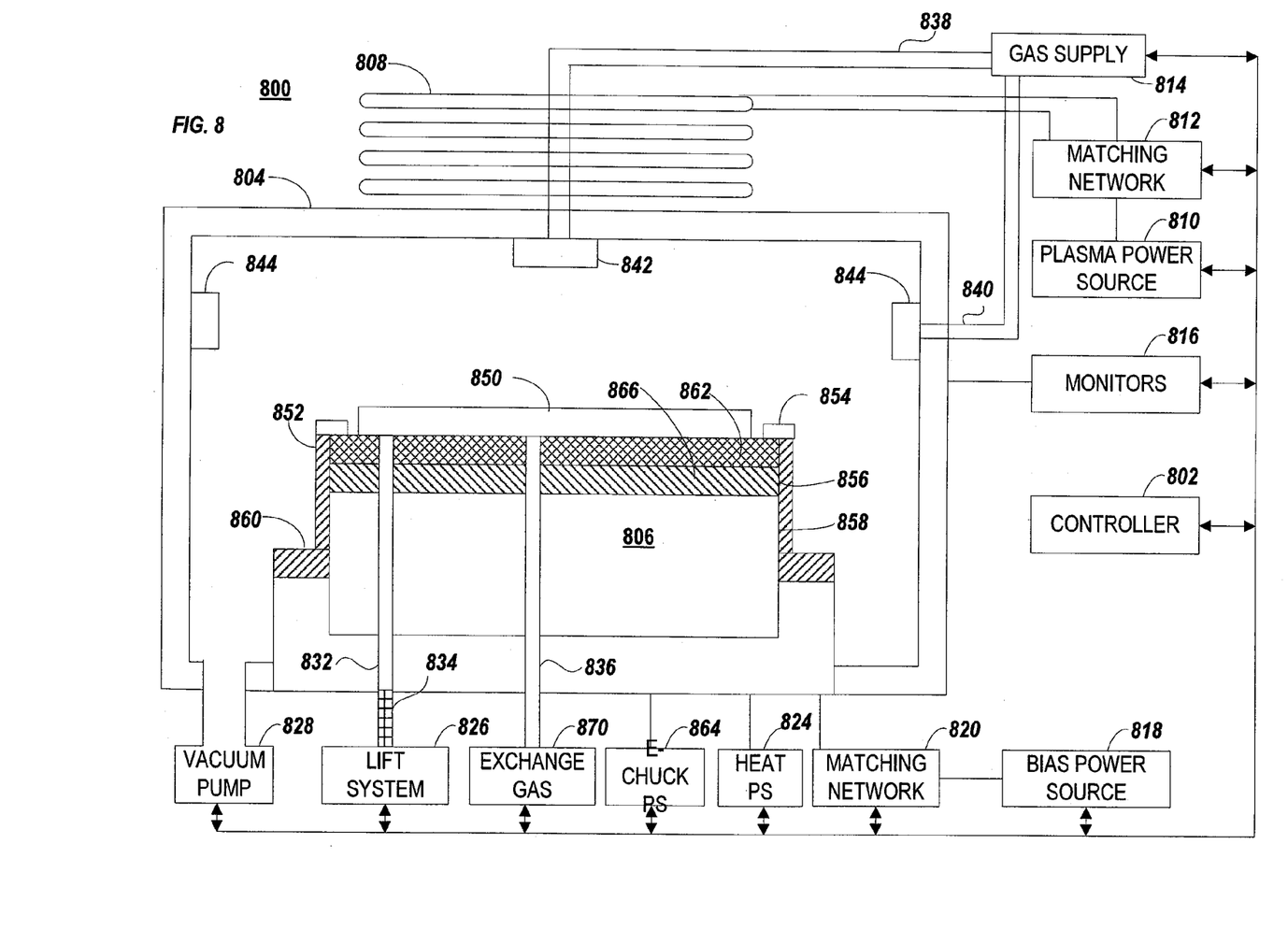
FIG. 8 is an illustration of a processing tool used to etch wafers in accordance with one embodiment of the invention.

The processes described above with reference to FIGS. 3-5 can be run in different process tools manufactured by different equipment manufacturers. An example of such a process tool is the Decoupled Plasma Source (DPS II™) etch tool, available from Applied Materials, Inc., located in Santa Clara, Calif., USA. Another example of a tool that can run these processes is illustrated in FIG. 8 below. The particular embodiment of the processing chamber illustrated in FIG. 8 shown herein is provided for illustrative purposes and should not be used to limit the scope of the invention.

FIG. 8 is an illustration of a processing tool used to etch wafers in accordance with one embodiment of the invention. The processing tool 800 includes a controller 802, a process chamber 804, a substrate pedestal 806, an antenna 808, a plasma power source 810, a first matching network 812, a gas supply 814, monitors 816, a bias power source 818, a second matching network 820, an e-chuck power supply 822, a heater power supply 824, a lift system 826 and a vacuum pump 828.

Controller 802 is used to control the process tool 800 along with its various components. Controller 802 can include a central processing unit (CPU), a memory, software, drivers, and various other circuits such as programmable logic controllers used for controlling the process tool.

Process chamber 804 can be constructed out of metal such as stainless steel or aluminum and includes the substrate pedestal 806, a plurality of process gas inlets 830, lift pins 832, guide holes 834, and exchange gas conduit 836. The ceiling of process chamber 804 can be a substantially flat dielectric or some other shape such as dome-shaped. The vacuum pump 828 is also coupled to the process chamber through a throttle valve and is used to both pump out the process chamber to base pressure and to maintain processing pressures. The throttle valve can be opened or closed to either reduce or increase the amount of pumping. The temperature of the process chamber wall may be controlled using fluid containing conduits that run through the process chamber wall either internally or externally. Process chamber 804 is also electrically grounded.

Substrate pedestal 806 supports wafer 850 for processing and can include an electrostatic chuck 852, an edge ring 854, the resistive heater 856, a heat sink 858, and a mounting assembly 860. Substrate pedestal 806 is coupled to the bias power source 818 through a second matching network 820. The bias power source 818 can provide up to 1500 Watts at a frequency of approximately 13.56 MHz that is capable of producing either continuous or pulsed power. In other embodiments, the bias power source can be a DC or pulsed DC source. The electrostatic chuck 852 can include one clamping electrode 862 or more and is controlled by a chuck power supply 864. The resistive heater 856 generally can include one heating element 866 or more and is regulated by a heater power supply 824. In other embodiments, the substrate pedestal 806 can include a mechanical chuck, a susceptor clamp ring, or other wafer retention mechanisms.

Antenna 808 is located above the process chamber 804 and includes one ore more inductive coil elements (i.e. a co-axial outer coil element and inner coil element) that may be selectively controlled. The antenna 808 is coupled to the plasma power source 810 through a first matching network 812. In one embodiment the plasma power source 810 can generate up to 3000 Watts at a tunable frequency in a range from 50 kHz to 13.56 MHz. In some etch embodiments the frequency is set to about 13.56 MHz.

Gas supply 814 is used to supply process gas to the process chamber 804. Gas supply 814 can include a gas source, a mass flow controller, or a plurality of mass flow controller connected to a manifold for mixing various gasses. The etchant gas and the passivation gases are provided to the process chamber 804 from a gas supply 814 through one or more gas conduits 838 and 840. In one embodiment, the etchant gas is provided through an inlet 842 located above the substrate pedestal 806, while the passivation gas is provided through a plurality of inlets 844. In an alternative embodiment, the passivation gas may be provided through an edge ring located proximate to an edge of a wafer 850 being etched. The inlets 844 are located to provide to control the concentration of the passivation gas in peripheral regions of the wafer 850.

In one embodiment, the etchant gas and the passivation gas are delivered to the process chamber 804 using separate gas conduits 838 and 840 respectively. In this embodiment the gases do not mix until they are dispersed into the process chamber 804. In the process chamber 804, the etchant and passivation gases form a gaseous mixture. During an etch process, the gaseous mixture can be energized to a plasma by applying power from the plasma source 810 to the antenna 808.

Monitors 816 include various systems used to control the process running in process too 800 such as residual gas analyzers, end-point detectors, pressure gauges, etc.

Lift system 826 is used to raise or lower the wafer 850 to or from the wafer support 806. Lift system 826 can include a plurality of lift pins 832 that travel through guide holes 834.

The temperature of the wafer 850 can be controlled by adjusting the temperature of the wafer pedestal 806. In one embodiment, an exchange gas, such as helium, from a gas source 870 is provided through a gas conduit 836 to channels located in the back side of the pedestal 806 under the wafer 850. The exchange gas is used to transfer heat between the pedestal 806 and the wafer 850. The pedestal 806 may be heated by a resistive heater 856 that is embedded in the pedestal 806 to a temperature and then the exchange gas provides uniform heating of the wafer 850. The wafer 850 may be heated to and maintained at a temperature between about 0 and 350° C.

It will also be recognized by those skilled in the art that, while the invention has been described above in terms of preferred embodiments, it is not limited thereto. Various features and aspects of the above-described invention may be used individually or jointly. Further, although the invention has been described in the context of its implementation in a particular environment and for particular applications, those skilled in the art will recognize that its usefulness is not limited thereto and that the present invention can be utilized in any number of environments and implementations.

What is claimed is:

1. A method for etching a high K dielectric layer during fabrication of a semiconductor device comprising:
   providing a wafer into a plasma etch processing chamber, wherein said wafer comprises the high K dielectric layer and a silicon oxide containing layer;
   applying a source power of between about 200 watts and 600 watts to generate an inductively coupled plasma;

introducing into said plasma etch processing chamber a gas consisting essentially of $BCl_3$ and $CH_4$;

heating said wafer to a temperature of between about 175° C. and 225° C.;

controlling a process pressure in the plasma etch processing chamber at between about 4 mTorr and 50 mTorr; and while applying the source power, heating the wafer, and controlling the process pressure, etching the high K dielectric layer with a selectivity of the high K dielectric layer to the silicon oxide containing layer of greater than 10:1.

2. The method of claim 1 wherein said high K dielectric layer comprises one of $HfO_2$ and $Al_2O_3$.

3. The method of claim 1 wherein said high K dielectric layer is located over said silicon oxide containing layer and wherein said etching step is stopped before a substantial amount of said silicon oxide containing layer is etched.

4. The method of claim 1 further comprising applying a bias power to said wafer.

5. The method of claim 4 wherein said bias power is less than 100 watts.

6. A method for etching a high K dielectric layer during fabrication of a semiconductor device comprising:

providing a wafer into a plasma etch processing chamber, wherein said wafer comprises the high K dielectric layer and a silicon oxide containing layer;

applying a source power to generate an inductively coupled plasma;

introducing into said plasma etch processing chamber a gas consisting essentially of $BCl_3$ and $CH_4$;

heating said wafer to a temperature of between about 175° C. and 225° C.; and while applying the source power and heating the wafer, etching the high K dielectric layer with a selectivity of the high K dielectric layer to the silicon oxide containing layer of greater than 10:1.

7. The method of claim 6 wherein said high K dielectric layer comprises one of $HfO_2$ and $Al_2O_3$.

8. The method of claim 6 wherein said high K dielectric layer is located over said silicon oxide containing layer and wherein said etching step is stopped before a substantial amount of said silicon oxide containing layer is etched.

9. A method for etching a high K dielectric layer during fabrication of a semiconductor device comprising:

providing a wafer into a plasma etch processing chamber, wherein said wafer comprises the high K dielectric layer and a silicon oxide containing layer;

applying a source power of between about 200 watts and 600 watts to generate an inductively coupled plasma;

introducing into said plasma etch processing chamber a gas consisting essentially of $BCl_3$ and $CH_4$;

heating said wafer to a temperature of between about 100° C. and 350° C.;

controlling a process pressure in the plasma etch processing chamber at between about 4 mTorr and 50 mTorr; and while applying the source power, heating the wafer, and controlling the process pressure, etching the high K dielectric layer with a selectivity of the high K dielectric layer to the silicon oxide containing layer of greater than 10:1.

10. The method of claim 9 wherein said high K dielectric layer comprises one of $HfO_2$ and $Al_2O_3$.

11. The method of claim 9 wherein said high K dielectric layer is located over said silicon oxide containing layer and wherein said etching step is stopped before a substantial amount of said silicon oxide containing layer is etched.

* * * * *